United States Patent
Amick et al.

(10) Patent No.: US 6,803,788 B2
(45) Date of Patent: Oct. 12, 2004

(54) SSTL VOLTAGE TRANSLATOR WITH DYNAMIC BIASING

(75) Inventors: Brian W. Amick, Austin, TX (US); Lynn A. Warriner, Round Rock, TX (US); Claude R. Gauthier, Cupertino, CA (US); Tri Tran, San Leandro, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 126 days.

(21) Appl. No.: 10/251,087

(22) Filed: Sep. 20, 2002

(65) Prior Publication Data

US 2004/0056681 A1 Mar. 25, 2004

(51) Int. Cl.[7] .............................................. H03K 17/687
(52) U.S. Cl. ........................................ 326/81; 326/68
(58) Field of Search ............................. 326/68–71, 80, 326/81, 83, 86

(56) References Cited

U.S. PATENT DOCUMENTS 5,054,001 A * 10/1991 Guillot ...................... 365/226
5,321,324 A * 6/1994 Hardee et al. ................. 326/62
5,760,621 A * 6/1998 Keeth ........................ 327/112
6,031,394 A * 2/2000 Cranford et al. .............. 326/81

OTHER PUBLICATIONS

"Stub Series Terminated Logic for 2.5 V (SSTL_2)"; JESD8–9A (Revision of JESD8–9) Dec. 2000, JEDEC Standard, JEDEC Solid State Technology Association (22 pages).

* cited by examiner

Primary Examiner—Don Le
(74) Attorney, Agent, or Firm—Osha & May L.L.P.

(57) ABSTRACT

A SSTL interface voltage translator that uses dynamic biasing to translate an input signal to an output signal is provided. The voltage translator uses a first device that, dependent on a first bias signal, causes the output signal to be pulled down, where the first bias signal is dependent on the input signal. The voltage translator also uses a second device that, dependent on a second bias signal, causes the output signal to be pulled up, where the second bias signal is dependent on the input signal.

13 Claims, 4 Drawing Sheets

SSTL VOLTAGE TRANSLATOR WITH DYNAMIC BIASING

BACKGROUND OF INVENTION

As shown in FIG. 1, a typical computer system 10 includes at least a microprocessor 12 (often referred to and known as "CPU") and some form of memory 14. The microprocessor 12 has, among other components, arithmetic, logic, and control circuitry that interpret and execute instructions necessary for the operation and use of the computer system 10. Specifically, FIG. 1 shows the computer system 10 having the microprocessor 12, memory 14, integrated circuits (ICs) 16 that have various functionalities, and communication paths 19, i.e., buses and wires, that are necessary for the transfer of data among the aforementioned components of the computer system 10.

In order to keep pace with improving technologies, computer system and circuit designers are constantly trying to improve and get the most out of their designs through the most cost-effective means. As faster versions of a particular CPU become available, a designer will often try to improve the throughput of their existing design by simply increasing the CPU clock frequency. However, after a certain point, the speed of the system's main memory becomes a limiting factor in optimizing the throughput of the system. To this end, designers have produced faster memories, which, in turn, has necessitated high-speed memory interfaces.

One type of design that has been used for high-speed memory interface applications involves the use of stub series termination logic (SSTL). SSTL is a standard created by the Joint Electron Device Engineering Council (JEDEC) to provide a termination scheme for high speed signaling in applications such as DDR-SDRAM. SSTL specifies particular switching characteristics such that high operating frequencies are available. As operating frequencies continue to increase and as the demand for faster memory interfaces has and continues to grow, the STTL interface standard continues to enjoy wide acceptance.

SUMMARY OF INVENTION

According to one aspect of the present invention, a computer system comprises a pre-driver stage comprising a voltage translator and an output buffer, wherein the voltage translator comprises: a first device that, dependent on a first bias signal, causes an output signal from the voltage translator to be pulled down, where the first bias signal is dependent on an input signal to the voltage translator; and a second device that, dependent on a second bias signal, causes the output signal to be pulled up, where the second bias signal is dependent on the input signal.

According to another aspect, a computer system comprises means for translating an input signal having a first voltage swing to an output signal having a second voltage swing, where the means for translating comprises: means for driving the output signal; and means for dynamically biasing the means for driving the output signal dependent on the input signal.

According to another aspect, a method for performing a SSTL interface operation comprises: inputting an input signal; dynamically generating a voltage on a first bias signal dependent on the input signal; dynamically generating a voltage on a second bias signal dependent on the input signal; and driving an output signal dependent on the first bias signal and the second bias signal.

Other aspects and advantages of the invention will be apparent from the following description and the appended claims.

DETAILED DESCRIPTION

SSTL interface design requires detailed consideration of the voltage levels supplied to different parts of the SSTL interface. Accordingly, with low power, and hence low voltage, devices, e.g., transistors, considerations must be made as to whether there is a chance for a large voltage to appear across the terminals of one or more of such low voltage devices. Such large voltages (breakdown voltages) can damage the device, thereby causing the SSTL interface, and, in turn, the entire microprocessor, to malfunction.

Figure 1:
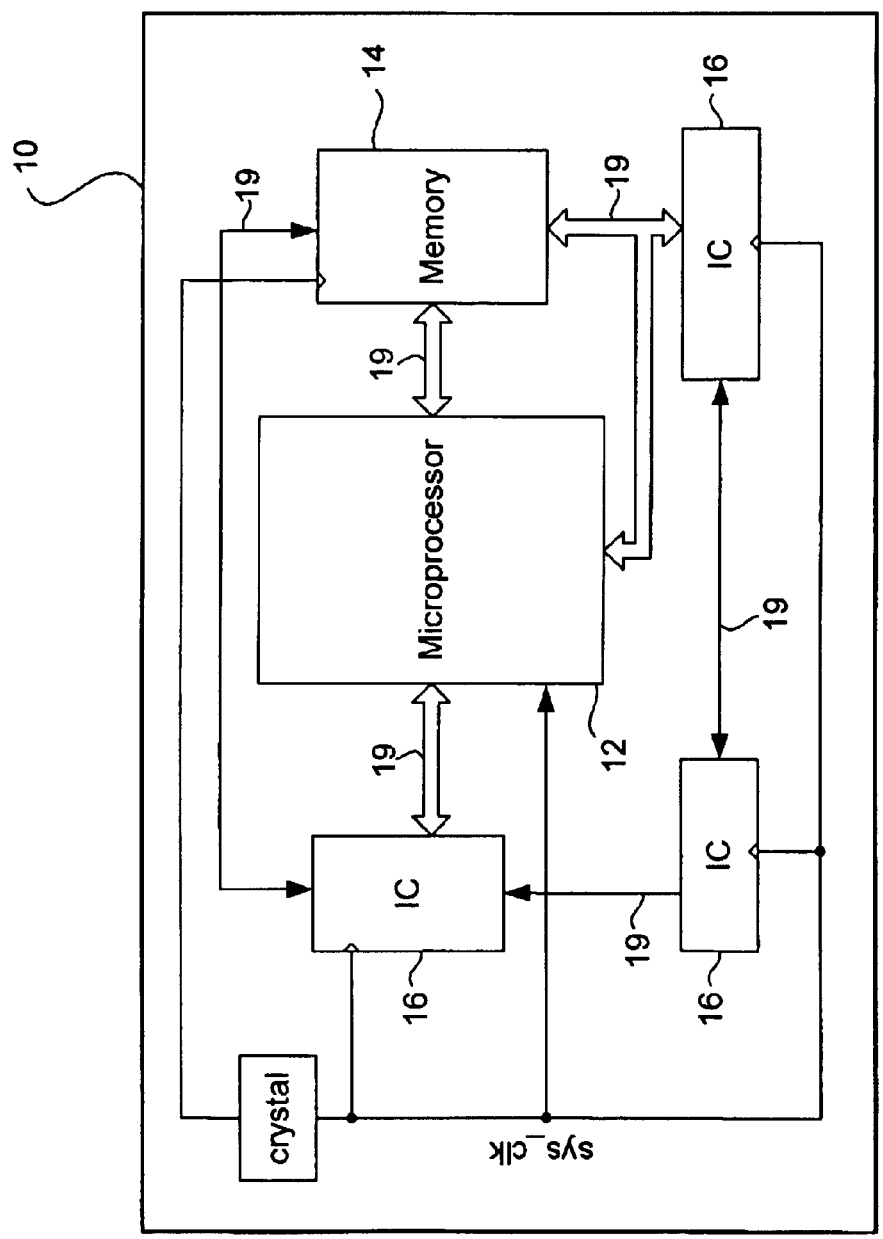
FIG. 1 shows a typical computer system.
Figure 2:
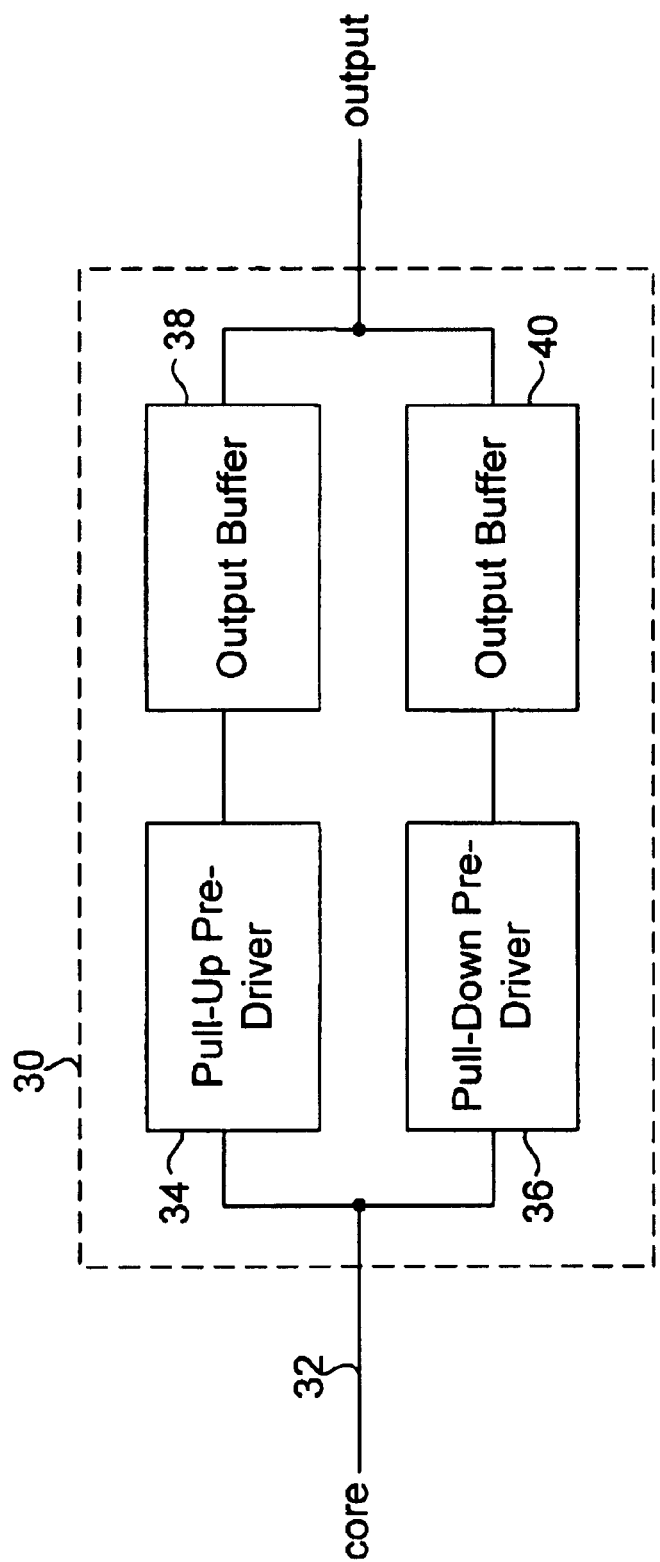
FIG. 2 shows a block diagram of a SSTL interface.

FIG. 2 shows a SSTL output interface 30. A core signal 32 (from the microprocessor (not shown)) serves as an input to a pull-up pre-driver 34 and a pull-down pre-driver 36. The core signal 32, coming from the microprocessor (not shown), has a low voltage swing, e.g., 0 to 1 volt, and thus, the pull-up pre-driver stage 34 is used to convert the core signal 32 to a larger voltage swing signal referenced to a power supply voltage (not shown) of the SSTL output interface 30, and the pull-down pre-driver stage 36 is used to convert the core signal 32 to a larger voltage swing signal references to ground. For example, for a core signal 32 that has a 1 volt voltage swing, e.g., between 0 and 1 volt, the pull-up pre-driver 34, operating off of a 2.5 volt SSTL power supply, could be used to generate a 1.5 volt voltage swing signal, e.g., from 1 to 2.5 volts, and the pull-down pre-driver 36, operating off the 2.5 volt SSTL power supply, could be used to generate a 1.5 volt voltage swing signal, e.g., from 0 to 1.5 volts.

The signals from the pull-up pre-driver 34 and the pull-down pre-driver 36 serve as inputs to output buffers 38, 40 that output the signals from the SSTL interface 30.

Figure 3:
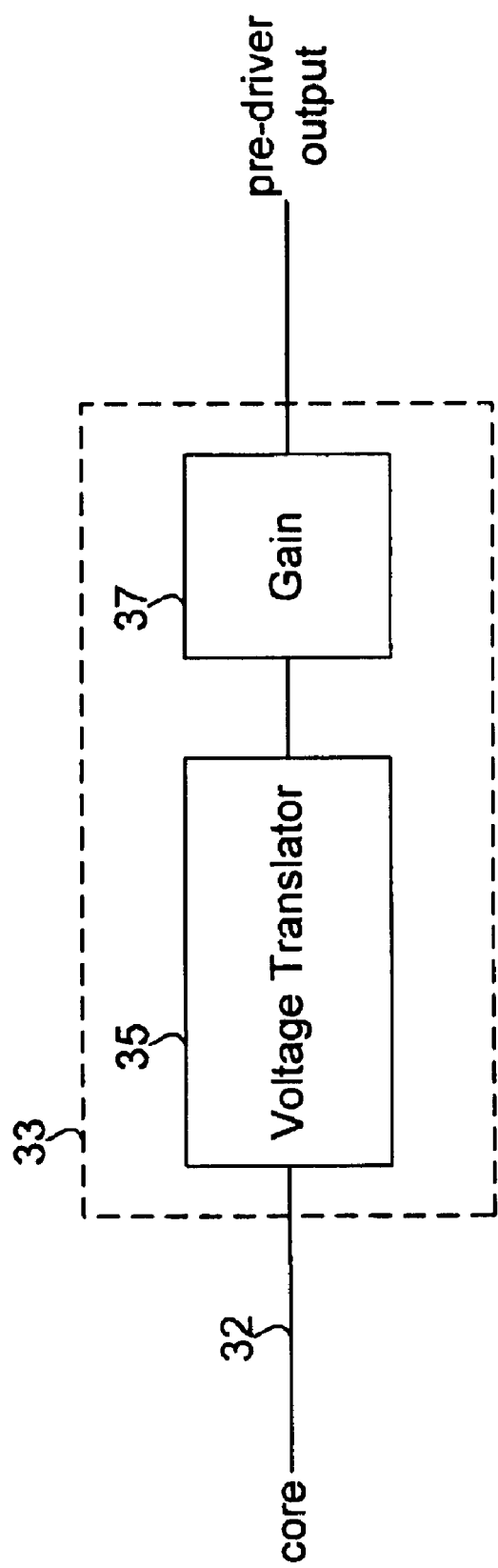
FIG. 3 shows a block diagram of a SSTL interface pre-driver.

Now referring to FIG. 3, a SSTL interface pre-driver 33 (such as the pre-drivers 34, 36 shown in FIG. 2) is typically formed by two stages: a voltage translator 35 and a gain stage 37. The voltage translator stage 35 is used to translate the incoming core signal 32 to a particular voltage swing signal that serves as an input to the gain stage 37, which, in turn, outputs the translated signal from the pre-driver 33.

Figure 4:
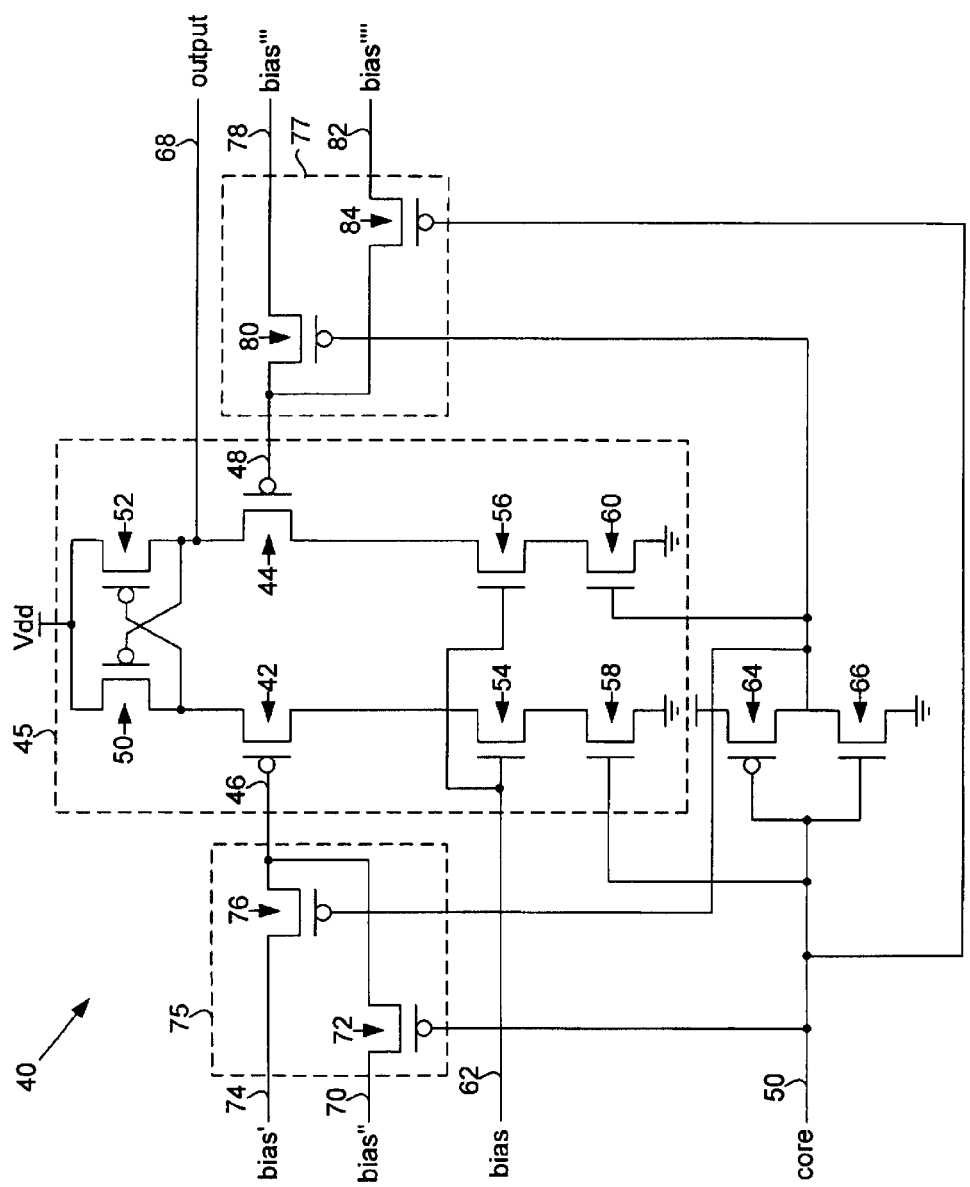
FIG. 4 shows a portion of a SSTL interface in accordance with an embodiment of the present invention.

FIG. 4 shows an exemplary voltage translator 40 in accordance with an embodiment of the present invention. The voltage translator 40 shown in FIG. 4 may be used for a pull-up pre-driver stage. However, those skilled in the art will understand that the features, structure, and principles of the present invention are equally or similarly applicable to a pull-down pre-driver stage.

The voltage translator 40 uses a push-pull structure with a device stack 45 formed by PMOS devices 42, 44 that are controlled by bias signals 46, 48, respectively, that dynamically change according to an input core signal 50 to the voltage translator 40. Particularly, the device stack 45 uses a pair of cross-coupled PMOS devices 50, 52 that are followed by PMOS devices 42, 44, which are then followed by NMOS devices 54, 56, and finally followed by NMOS devices 58, 60.

NMOS devices 54, 56, are controlled by bias voltage 62. NMOS devices 58, 60 are controlled by non-complemented and complemented versions of the input core signal 50 (via the inverter formed by transistors 64, 66). The output 68 from the voltage translator 40 is coupled to the signal lines, i.e., wires, that are used to cross-couple PMOS devices 50, 52.

When the input core signal 50 goes 'low,' (1) a first bias voltage 70, through PMOS device 72 (which is controlled by the input core signal 50), is provided to bias signal 46, (2) NMOS device 58 is switched 'off,' (3) a third bias voltage 82, through PMOS device 84 (which is controlled by the input core signal 50), is provided to bias signal 48, and (4) an inverter formed by PMOS device 64 and NMOS device 66 outputs 'high' to NMOS device 60 and PMOS device 80. The 'high' to NMOS device 60 switches NMOS device 60 'on' and pulls the right side of the device stack 45 down, i.e., to ground. Dependent on the input core signal 50 being 'low,' the bias signal 48 to PMOS device 44 causes PMOS device 44 to conduct and pull the output 68 of the voltage translator 40 down via the biased NMOS device 56 and 'on' NMOS device 60.

Moreover, when the output 68 of the voltage translator 40 goes 'low,' PMOS device 50 switches 'on' and allows Vdd to propagate to a terminal of PMOS device 42. However, the providing of the first bias voltage 70 to bias signal 46 ensures that too large of a voltage is not placed across PMOS device 42, thereby not damaging PMOS device 42.

When the input core signal 50 goes 'high,' (1) a second bias voltage 74, through PMOS device 76 (which is controlled by a complement of the input core signal 50), is provided to bias signal 46, (2) NMOS device 58 is switched 'on,' (3) a fourth bias voltage 78, through PMOS device 80 (which is controlled by a complement of the input core signal 50), is provided to bias signal 48, and (4) the inverter formed by PMOS device 64 and NMOS device 66 outputs 'low' to NMOS device 60 and PMOS device 80. The 'on' NMOS device 58 pulls the left side of the device stack 45 down, i.e., to ground. Dependent on the input core signal 50 being 'high,' the bias signal 46 to PMOS device 42 causes PMOS device 42 to conduct and pull the input of PMOS device 52 down via the biased NMOS device 56 and 'on' NMOS device 60. When the input of PMOS device 52 is pulled down, PMOS device 52 switches 'on' and allows Vdd to propagate to the output 68 of the voltage translator 40.

Moreover, when the output 68 of the voltage translator 40 goes 'high,' Vdd also propagates to a terminal of PMOS device 44. However, the providing of the fourth bias voltage 78 to bias signal 48 ensures that too large of a voltage is not placed across PMOS device 44, thereby not damaging PMOS device 44.

Those skilled in the art will note that PMOS devices 72, 76 perform a multiplexing function, and thus, form a first 'multiplexer' portion 75 of the voltage translator 40. Further, those skilled in the art will note that PMOS devices 78, 82 perform a multiplexing function, and thus, form a second 'multiplexer' portion 77 of the voltage translator 40.

Those skilled in the art will understand that, in one or more embodiments, dynamic biasing may be used to control NMOS devices within the device stack 45 of the voltage translator 40.

Advantages of the present invention may include one or more of the following. In one or more embodiments, because a voltage translator for a SSTL interface pre-driver uses dynamic biasing, voltage translation speed is increased, which, in turn, reduces potential crow-bar current at an output of the voltage translator.

In one or more embodiments, because a voltage translator for a SSTL interface pre-driver uses dynamic biasing, small devices, such as transistors, may be used in the implementation of the voltage translator.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A computer system, comprising:
   a pre-driver stage comprising a voltage translator, the voltage translator comprising:
      a first device that, dependent on an input of the first device and an input signal to the voltage translator, causes a voltage of an output signal from the voltage translator to be pulled down, wherein propagation of a first input bias signal to the input of the first device is dependent on the input signal, and
      a second device that, dependent on an input of the second device and the input signal, causes the voltage of the output signal to be pulled up, wherein propagation of a second input bias signal to the input of the second device is dependent on the input signal.

2. The computer system of claim 1, further comprising:
   an output buffer operatively connected to the pre-driver stage, wherein the output buffer buffers an output from the pre-driver stage.

3. The computer system of claim 1, the voltage translator further comprising:
   a multiplexer portion arranged to output the first input bias signal to the input of the first device, wherein the multiplexer portion comprises at least one device responsive to one selected from the group consisting of the input signal and a complement of the input signal.

4. The computer system of claim 3, the voltage translator further comprising:
   at least one device, operatively connected to the first device, responsive to a bias voltage and one of the input signal and the complement of the input signal.

5. The computer system of claim 1, the voltage translator further comprising:

a multiplexer portion arranged to output the second input bias signal to the input of the second device, wherein the multiplexer portion comprises at least one device responsive to one selected from the group consisting of the input signal and a complement of the input signal.

6. The computer system of claim 5, the voltage translator further comprising:

at least one device, operatively connected to the second device, responsive to a bias voltage and one of the input signal and the complement of the input signal.

7. The computer system of claim 1, the voltage translator further comprising:

cross-coupled devices responsive to the first and second devices and operatively connected to the output signal.

8. The computer system of claim 1, wherein a voltage swing of the input signal is less than a voltage swing of the output signal.

9. The computer system of claim 1, wherein a power supply voltage of the voltage translator is less than a breakdown voltage of at least one of the first device and the second device.

10. A computer system, comprising:

means for translating an input signal having a first voltage swing to an output signal having a second voltage swing, the means for translating comprising:
means for driving the output signal, and
means for dynamically biasing the means for driving the output signal, wherein the means for dynamically biasing propagates at least one input bias signal to the means for driving the output signal dependent on the input signal.

11. The computer system of claim 12, wherein a voltage swing of the input signal is less than a voltage swing of the output signal.

12. A method for performing a SSTL interface operation, comprising:

inputting an input signal;

dynamically generating a voltage on a first bias signal, wherein propagation of at least one input bias voltage to the first bias signal is dependent on the input signal;

dynamically generating a voltage on a second bias signal, wherein propagation of at least one input bias voltage to the second bias signal is dependent on the input signal; and driving an output signal dependent on the first bias signal the second bias signal.

13. The method of claim 12, wherein a voltage swing of the input signal is less than voltage swing of the output signal.

* * * * *

UNITED STATES PATENT AND TRADEMARK OFFICE
CERTIFICATE OF CORRECTION

PATENT NO.   : 6,803,788 B2
DATED        : October 12, 2004
INVENTOR(S)  : Brian W. Amick et al.

It is certified that error appears in the above-identified patent and that said Letters Patent is hereby corrected as shown below:

<u>Column 6,</u>
Line 19, insert -- and -- after "signal".

Signed and Sealed this

Eighth Day of March, 2005

JON W. DUDAS
*Director of the United States Patent and Trademark Office*